United States Patent [19]
Tanaka et al.

[11] 4,293,842
[45] Oct. 6, 1981

[54] ELECTRONIC DISPLAY DEVICE FOR USE IN MOTOR CARS

[75] Inventors: Toyonaru Tanaka, Tokyo; Hideki Naito, Koganei, both of Japan

[73] Assignee: Jeco Co., Ltd., Kawasaki, Japan

[21] Appl. No.: 60,474

[22] Filed: Jul. 25, 1979

[30] Foreign Application Priority Data

Jul. 31, 1978 [JP] Japan .............................. 53-105310[U]
Dec. 13, 1978 [JP] Japan .............................. 53-170367[U]

[51] Int. Cl.³ .............................................. G08B 19/00
[52] U.S. Cl. .................................. 340/52 F; 340/706; 368/6; 368/10
[58] Field of Search ................... 340/52 R, 52 F, 706; 58/50 R, 152 R; 368/6, 10

[56] References Cited

U.S. PATENT DOCUMENTS

| | | | |
|---|---|---|---|
| 3,566,401 | 2/1971 | Smith et al. | 340/52 F |
| 3,626,367 | 12/1971 | Howard et al. | 340/52 F |
| 3,816,730 | 6/1974 | Yamamoto et al. | 58/152 R |
| 4,022,017 | 5/1977 | Aoki et al. | 58/50 R |
| 4,033,108 | 7/1977 | Bennett et al. | 58/50 R |
| 4,035,627 | 7/1977 | Dickinson et al. | 58/152 R |
| 4,047,010 | 9/1977 | Perotto et al. | 58/50 R |
| 4,140,996 | 2/1979 | Leitch et al. | 340/52 F |

*Primary Examiner*—David L. Trafton
*Attorney, Agent, or Firm*—Blakely, Sokoloff, Taylor & Zafman

[57] ABSTRACT

An electronic display device for use in a motor car wherein the contents of the display are determined by the respective positions of a manually operated switch and the ignition switch is disclosed. A control circuit detects the respective positions of the two switches and thereby determines the data to be displayed.

6 Claims, 4 Drawing Figures

ELECTRONIC DISPLAY DEVICE FOR USE IN MOTOR CARS

BACKGROUND OF THE INVENTION

This invention relates to electronic display device, for example an electronic timepiece for use in motor cars, wherein the number of the operating switches is reduced.

In recent years, digital type electronic display devices utilizing quartz such as electronic timepieces have been widely used for motor cars. Considering an electronic timepiece as an example, the timepiece is constantly driven by receiving a driving current from a battery, but for the purpose of decreasing the power consumption of the battery, a display device of the timepiece which consumes relatively large power is operated only when the accessory contact or an ignition contact of an engine key switch is closed. For this reason, it has been impossible to know the time displayed by the timepiece when these contacts of the engine key switch are open or when an engine key is removed from the engine key switch.

For this reason, a time display device has been proposed wherein an independent manually operated switch is provided for the timepiece so that when this switch is closed, the time is displayed for a definite interval even when the engine key switch is open.

In such a display device, however, it is general to further provide independent manually operated switches for selecting additional display functions (added to a normal display of the time) of the device with the result that the operation panel requires a large area and becomes complicated, raising the production cost and impairing the appearance and ease of operation. Especially, in a digital electronic timepiece which is provided with many correction knobs, problems raised by the addition of separate manually operated switches are aggravated.

SUMMARY OF THE INVENTION

It is an objects of this invention to provide an improved electronic display device for use in a motor car capable of decreasing the number of the operating switches so as to simplify the construction of the operation panel, decreasing the cost and to improve the operating performance.

Another object of this invention is to provide an electronic display device wherein the function of changing the contents of display or rendering the display activated which is effected by means of manually operated switches is switched over by turning on-off an accessory contact or an ignition contact of the engine key switch with a minimized number of the manually operated switches.

According to this invention, there is provided an electronic display device for use in a motor car, comprising manually operated switch means for changing contents displayed by the display device or performances thereof, and a control circuit actuated by a signal generated by an engine key switch of the motor car, the control circuit including means responsive to the operation of the manually operated switch means for switching over the contents displayed by the display device or performances thereof.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figure 1:
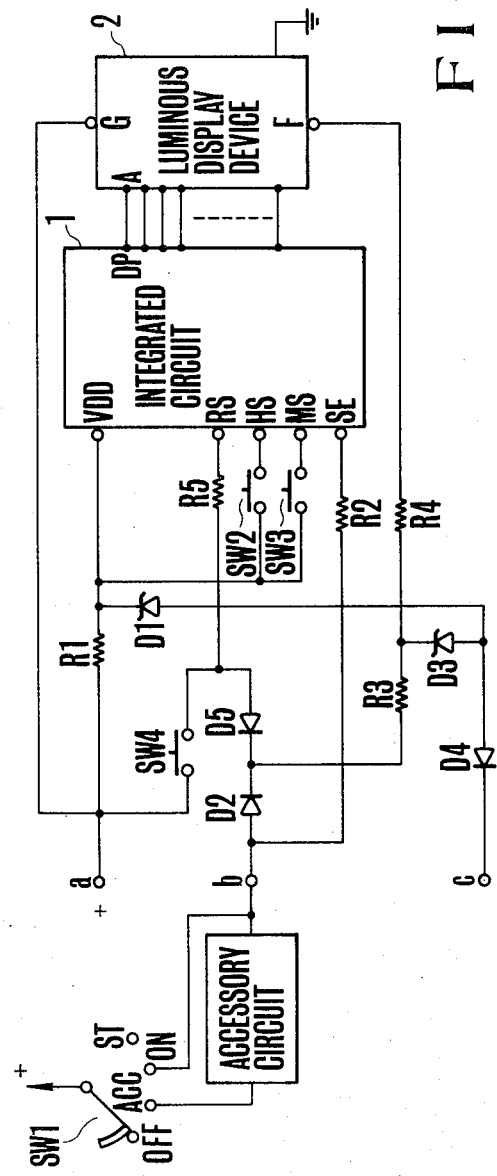
FIG. 1 is a block diagram showing one embodiment of this invention applied to an electronic timepiece for use in a motor car.

A preferred embodiment of this invention applied to an electronic timepiece of a motor car shown in FIG. 1 comprises an integrated circuit 1 such as for example Type No. MB 8731 manufactured by Fuji Tsushinki Seizo Corp., Japan including a crystal oscillator, a frequency divider, a counter, a quick correction circuit, decoder, display drive circuit, etc. The integrated circuit 1 is provided with a source terminal $V_{DD}$, a reset terminal RS, an hour set terminal HS, a minute set terminal MS, a set enabling terminal SE and a plurality of display output terminals DP. Although not shown, quartz connecting terminal and grounding terminal are also provided and a quartz vibrator such as designated in FIG. 2 at 20 is connected to the quartz connecting terminal. To the output terminals DP is connected a well known fluorescent display device in the form of a tube including a plurality of digits each having letter 8 shaped display segments each including an anode terminal A. The tube also includes a grid terminal G and a filament terminal F. A terminal a is connected to a positive terminal of a battery, not shown, and a terminal b is connected to the positive terminal through an accessory contact ACC of an engine key switch $SW_1$ via an accessory circuit, such as a car radio receiver, and a terminal c is grounded. The terminal b is also connected to an ignition contact ON of the engine key switch $SW_1$. As is well known in the art, the engine key switch $SW_1$ comprises, for example, in addition to contact ACC and contact ON, a start contact ST and a movable contact having a width sufficient to bridge two adjacent contacts.

The terminal a is connected to the source terminal $V_{DD}$ of the integrated circuit 1 via a resistor R1 and voltage applied to the source terminal is maintained at a constant value by a Zener diode D1. Furthermore, the terminal a is connected to the reset terminal RS of the integrated circuit 1 via a series circuit made up of a push button switch $SW_4$ and a resistor R5, which constitute an operating circuit. The source terminal $V_{DD}$ of the integrated circuit 1 is connected to its hour set terminal HS via a push button switch $SW_2$ and also to its minute set terminal MS via a push button switch $SW_3$. The switches $SW_2$, $SW_3$ and $SW_4$ are herein generally called manually operated switch means. Across the juncture between push button switch $SW_4$ and resistor R5 and the juncture between a diode D2 and a resistor R3 is connected a reverse current preventing diode D5. The set enabling terminal SE is connected directly to the accessory terminal b without passing through a reverse current preventing diode D2. Although not shown in the drawing, the integrated circuit 1 contains a set enabling circuit including a gate circuit with its input connected to the set enabling terminal SE. The juncture between diodes D2 and D5 is connected to the filament terminal F of the fluorescent display device 2 via serially connected resistors R3 and R4, and the voltage applied to the filament terminal F is maintained at a constant value by a Zener diode D3. The grid terminal G of the display device 2 is connected directly to the battery terminal a. A diode D4 is connected between the grounding terminal c and the Zener diodes D1 and D3. Upon connection of the terminal a to the battery, a voltage is impressed upon the source terminal $V_{DD}$ of the integrated circuit 1 whereby the integrated circuit operates to count the number of the clock signals to commence the timepiece driving operation. Then, an output signal is produced at the display output terminal DP. Although a positive bias voltage is applied to the grid terminal G, the fluorescent display device 2 may not operate since at this time no filament current flows to the filament terminal F. At this phase, if the push button switch SW$_2$ is depressed, the hour display is rapidly changed whereas if the push button switch SW$_3$ is depressed, the minute display is rapidly changed, thus rapidly correct the hour and minute displays.

Thus, under a condition in which voltage is not supplied to terminal b by the opening of the accessory contact or of the ignition contact of the engine key switch, the fluorescent display device 2 may not luminesce because no voltage is applied to its filament terminal F which is utilized as an operating terminal. Upon depression of the push button switch SW$_4$, the voltage of the battery is applied to the filament or operating terminal F even if the engine key switch is being opened, so that the display device 2 operates to display hours and minutes. At this time, the battery voltage is applied to the reset terminal RS via resistor R5. But, since the set enabling terminal RS is at an "L" level, the set enabling circuit is disabled thus performing no reset correction. For this reason, the time is displayed only during an interval in which the push button switch SW$_4$ is being depressed or during a definite interval following the release of the push button switch SW$_4$. When the accessory contact or the ignition contact of the engine key switch is closed, the fluorescent display device will operate normally to display time. At this time, however, the set enabling terminal SE is at a "H" level, the time can be corrected. Namely, if the push button switch SW$_4$ is depressed, it operates to correct the setting, thus resetting to zero the minute display of the fluorescent display device 2. In this manner, the push button switch SW$_4$ is used to manually operate the display device and to correct resetting. For this reason, according to this invention, it is possible to add the function of the manual control of the display without using any additional switch exclusively used for resetting.

Although, in the embodiment shown, the push button switch SW$_4$ was connected to the reset terminal RS, when it is connected to the hour set terminal HS or minute set terminal MS, the push button switch SW$_2$ or the push button switch SW$_3$ may be omitted.

In a timepiece including a switch which, when operated, displays, for a definite time, a calendar, this switch may be used for calendar display as well as for manual setting of the time displayed. Furthermore, an integrated circuit containing a set enabling circuit provided with a set terminal SE was described, it will be clear that such a set enabling circuit may be disposed on the outside of the integrated circuit, and that fluorescent type display segments may be substituted by well known light emitting diodes, liquid crystal elements or the like. Furthermore, although in the foregoing embodiment, a reset enabling circuit of the control circuit was used to switch the time display correction, and manual display operation for momentarily display time while the display device is not used to display time, it is also possible to switch between an electronic timepiece and other instruments or devices, and to switch the display contents of the same display device. In addition, it should be understood that the number of the operating switches is not limited to one but a number of such switches may be provided, if desired. Instead of digital display, analogue display can also be used.

According to the embodiment described above, by opening and closing of the accessory contact or the ignition contact of the engine key switch, the displayed contents or display performances which are changed by means of manually operated switches can be switched over, thus minimizing the number of the manually operated switches and simplifying the panel construction.

Figure 2:
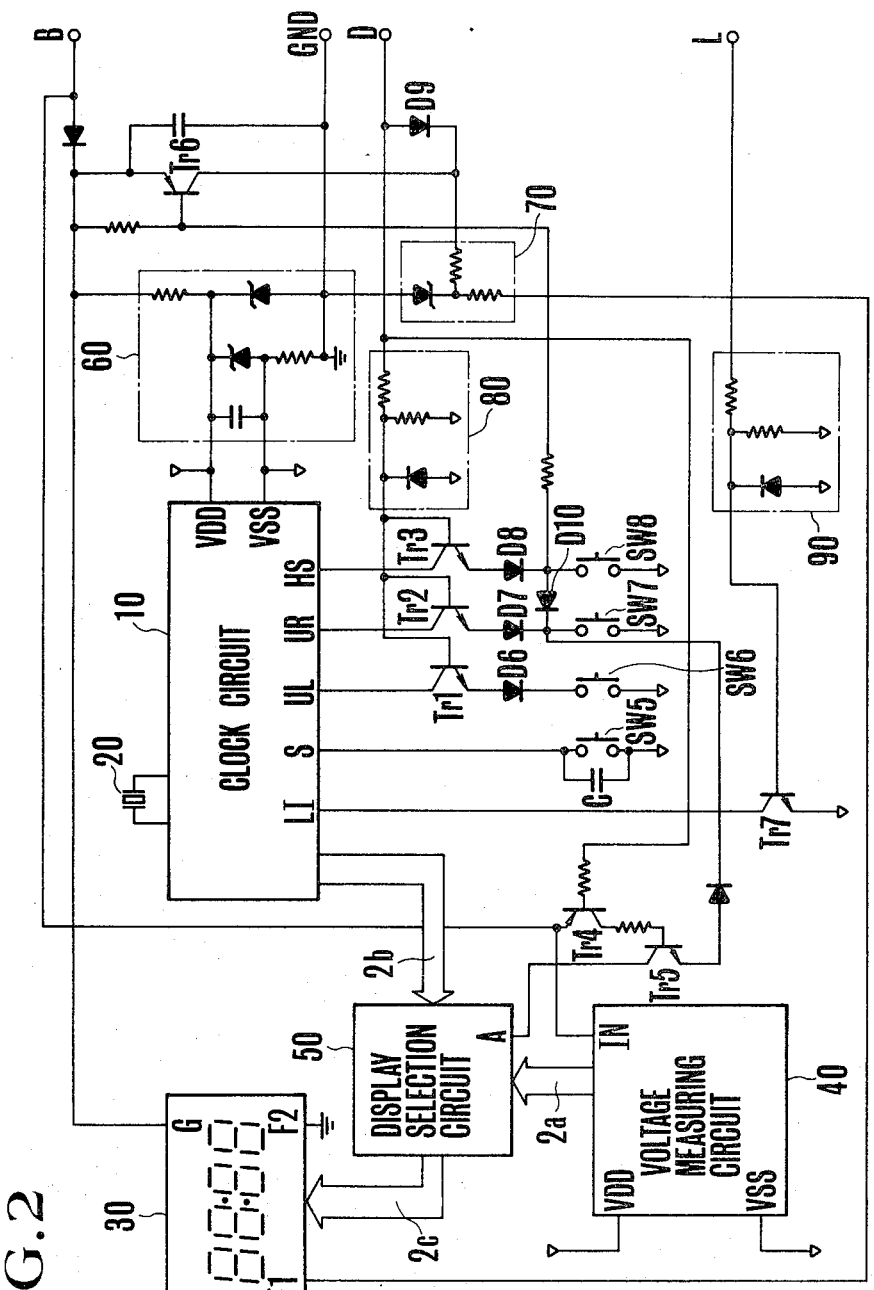
FIG. 2 shows a connection diagram showing another embodiment of this invention.

FIG. 2 shows another embodiment of this invention comprising a well known clock circuit 10 such as for example Type No. MJ002 manufactured by Nippon Denso Co., Japan. The clock circuit 10 includes a crystal oscillator connected to a quartz vibrator 20, a frequency divider and a decoder and sends out timepiece display signals for digitally operating display segments. There are also provided a fluorescent display device 30 including a plurality of digit segments, a voltage measuring circuit 40, such as for example Type No. LD130 manufactured by Siliconix, U.S.A, which effects an analogue-digital conversion of voltage to produce digital signals for operating the display segments, and a display selection circuit 50 which selects either one of the time display signal and the voltage display signal, the detail thereof being described later with reference to FIG. 3. There are also provided a positive terminal B connected to the positive pole of the battery, a grounding terminal GND, a terminal D which is connected to be applied with the battery voltage when the accessory contact or the ignition contact of the engine key switch is closed, the terminal D corresponding to the terminal b shown in FIG. 1, and a writing terminal L which is connected to receive a voltage when a writing switch, not shown, is closed. Protective circuits 60, 70, 80 and 90 respectively bounded by dot and dash lines are provided for the purpose of stabilizing the operation of the circuit but as they are immaterial to the operation of the circuit, their detailed description is believed unnecessary.

The clock circuit 10 is provided with a correct time set terminal HS which corrects the time by setting to zero the righthand two minute displaying digits, a correcting terminal UR which rapidly changes righthand two digits for correcting minute display or day display, a correcting terminal UL which rapidly changes lefthand two digits for rapidly correcting hours or months, a calendar terminal S for displaying a calendar, and a writing terminal LI. When these terminals are connected to a voltage source terminal VSS, operations assigned to these terminals are performed. The fluorescent display device 30 in the form of a tube is provided with a grid terminal G connected to the positive terminal B and filament terminal F1 connected to terminal D. A filament terminal F2 is normally grounded and the anode electrode of respective segments is supplied with a display signal from the display selection circuit 50.

The voltage measuring circuit 40 is provided with an input terminal IN which is connected to terminal B to be applied with the battery voltage to be constantly measured or monitored. The display selection circuit 50 is provided with a control terminal A which is normally at a "H" level, whereby a time display signal 2b is supplied as an output 2c to the fluorescent display device 30. When the control terminal A is connected to a source terminal VSS via transistor Tr5 and switch SW7 which are turned on, it becomes an "L" level, thus producing a voltage display signal 2a as output 2c.

A manually operated push button switch SW5 is connected between the calendar terminal S and the voltage terminal VSS and a noise preventive capacitor C is connected across the push button switch SW5. Likewise, one terminal of a push button switch SW6 is connected to the correction terminal UL of the clock circuit 10 via serially connected transistor Tr1 and diode D6, while the other contact is connected to the voltage terminal VSS. One terminal of a push button switch SW7 is connected to the correction terminal UR via a series circuit comprising a transistor Tr2 and a diode D7, while the other terminal is connected to the voltage terminal VSS. One terminal of a switch SW8 is connected to the correct time set terminal HS via serially connected transistor Tr3 and a diode D8 whereas the other terminal is connected to the voltage terminal VSS.

The circuit shown in FIG. 2 operates as follows. More particularly, when the accessory contact or the ignition contact of the engine key switch is closed to apply voltage to the terminal D, this voltage is applied to the filament terminal F1 via diode D9 so that current flows through the filament of the display device to cause the fluorescent display device 30 to luminesce. Under this condition, since both transistors Tr4 and Tr5 are in their OFF state, the control terminal A of the display selection circuit 50 bears a "H" level, while the time display signal from the clock circuit 10 is supplied to the fluorescent display device 30 via the display selection circuit 50, thereby displaying hours and minutes. Upon closure of switch SW5, the calender terminal becomes an "L" level so that the hour and minute displays are extinguished and substituted by a calendar display representing months and days. The circuit is constructed such that even when the switch SW5 is opened the display of the calender will continue for several seconds. Where voltage is being impressed upon terminal D, transistors Tr1, Tr2 and Tr3 become ON state because their base electrodes are positively biased. For this reason, upon closure of switch SW6, the voltage of the correction terminals becomes low level thus rapidly correcting the time, whereas when the switch SW7 is closed, the voltage of the correction terminal UR becomes the low level "L", thus rapidly correcting minutes. Similarly, when switch SW8 is closed, the voltage of the correct time set terminal becomes the low level, thus adjusting the time to a correct time, Upon closure of switch SW7, the voltage of the emitter electrode of transistor Tr5 becomes the low level "L". But since transistor Tr4 is in its OFF state, no base current flows through this transistor thus maintaining it in the OFF state. Accordingly, the voltage of the control terminal A of the display selection circuit 50 will be continuously maintained at the "H" level. Under these conditions, transistors Tr1, Tr2 and Tr3 permit setting of the corresponding corrections and possess the function of a set enabling circuit.

When the accessory contact or the ignition contact of the engine key switch is opened to remove voltage from contact D, no current flows through the filament. Thus the fluoroscent display device 3 stops to display even when a display signal is applied thereto. Since transistors Tr1, Tr2 and Tr3 are OFF, even when switches SW6, SW7 and SW8 are closed, the correction terminals UL and UR and the correct time setting terminals HS will not become "L" level.

At this time, the base voltage of the transistor Tr4 becomes the low level, so that this transistor is in its ON state. Under these conditions, when switch SW8 is closed, the base voltage of transistor Tr6 becomes the "L" level, thus turning ON the same, with the result that the voltage of the terminal B is applied to the filament terminal F1, thus operating the fluorescent display device 30. Since the clock circuit 10 is operating constantly, the fluorescent display device 30 displays hours and minutes. Closure of switch SW8 does not turn ON transistor Tr5 because diode D10 is connected reversely so that the emitter potential of the transistor will not be changed to the low level "L". Consequently, the control terminal A of the display selection circuit 50 is still maintained at the "H" level. Under these conditions, when voltage is impressed upon terminal D, the switch SW8 functions to change the displayed time to the correct time when it is desired to change the hour and minute displays to the correct time, whereas when voltage is not impressed upon the terminal D the switch SW8 functions to change the display from no display to the hour and minute displays. Transistors Tr3 and Tr6 operates depending upon the presence and absence of voltage on terminal D to constitute a transfer circuit for switching the abovedescribed functions of the switch SW8.

Closure of switch SW7 turns ON the transistor Tr7 to operate the luminous display device 30 while at the same time it changes the emitter voltage of transistor Tr5 to the "L" level, thus turning it ON wth the result that the emitter voltage of transistor Tr5 becomes the "L" level, thus changing the voltage of the control electrode A of the display selection circuit 50 to the low level "L". Consequently, the voltage display signal produced by the voltage measuring circuit 40 is selected by the display selection circuit 50 and supplied to the fluorescent display device 30 to digitally display the value of the battery voltage. Consequently, it is possible to accurately measure and display the battery voltage when the battery is not charged while the engine of the motor car is stopped. At this time, depending upon the presence and absence of the voltage impressed upon terminal D the switch SW7 functions to rapidly change the hour and minute display to the minute display or to change the display mode from no display to battery voltage display. Transistors Tr2, Tr6, Tr4 and Tr5 constitute a transfer circuit which switches the operation of the switch SW7. When switch SW7 is closed, although the emitter electrode of transistor Tr3 is connected to the VSS voltage terminal through diodes D8 and D10 due to the forward voltage drop of diode D10, the emitter voltage will not be decreased sufficiently so that transistor Tr3 maintains its OFF state. Irrespective of the presence and absence of the voltage on terminal D, the voltage at the writing terminal LI of the clock circuit 10 is maintained at the level "L" by the voltage at the terminal L at the time transistor Tr7 becomes ON.

While in the foregoing embodiment the switches SW7 and SW8 were used as transfer switches, switches SW5 and SW6 can also be used as transfer switches. Generally, when the engine is rotating and while the car is running, the voltage is applied on terminal D, the items to be displayed under these conditions include, in addition to hours and minutes described above, a calender, rapid correction of display, correct time, car speed, number of revolutions of the engine, cooling water temperature, pressure of the lubricant, charging current of the battery and so forth. No voltage on terminal D corresponds to engine stop, the items to be displayed include transfer from no display to so-called manual hour, minute display wherein hours, minutes and seconds are displayed for a definite interval, and battery voltage. Items to be displayed in each case include running distance and the remaining quantity of the fuel. The switches can be transferred to perform any one of various combinations of these items. Since a calender is normally used except correction of time, and setting of the correct time, it is advantageous to use a mode of operation wherein the time is automatically displayed for a definite interval after operation of the switches.

Figure 3:
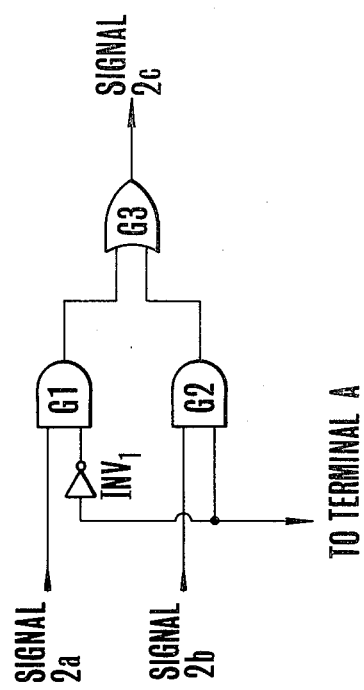
FIG. 3 is a connection diagram showing one example of the display selection circuit shown in FIG. 2.

One example of one component of the display selection circuit 50 is illustrated in FIG. 3, which comprises an AND gate circuit G1 with one input connected to receive the voltage display signal 2a from the voltage measuring circuit 40 and the other input connected to the control terminal A via an inverter INV1, an AND gate circuit G2 with one input connected to receive the time display signal 2b from the clock circuit 10 and the other input connected to the control terminal A, and an OR gate circuit G3 having its inputs connected to outputs of the AND gate circuits G1 and G2 and its output connected to the fluorescent display device 30 for supplying thereto the output 2c. The one component of the above construction is provided for each of 7 display segments of each digit in the fluorescent display device 30.

In operation, when the control terminal A is at the "H" level, the time display signal 2b is allowed to pass through the AND gate circuit G2 and the OR gate circuit G3, thereby being delivered out as the output 2c. On the other hand, when the control terminal A is rendered "L" level, this "L" level is inverted by the inverter INV1 so that the voltage display signal 2a is allowed to pass through the AND gate circuit G1 and the OR gate circuit G3, thereby being transmitted as the output 2c.

Figure 4:
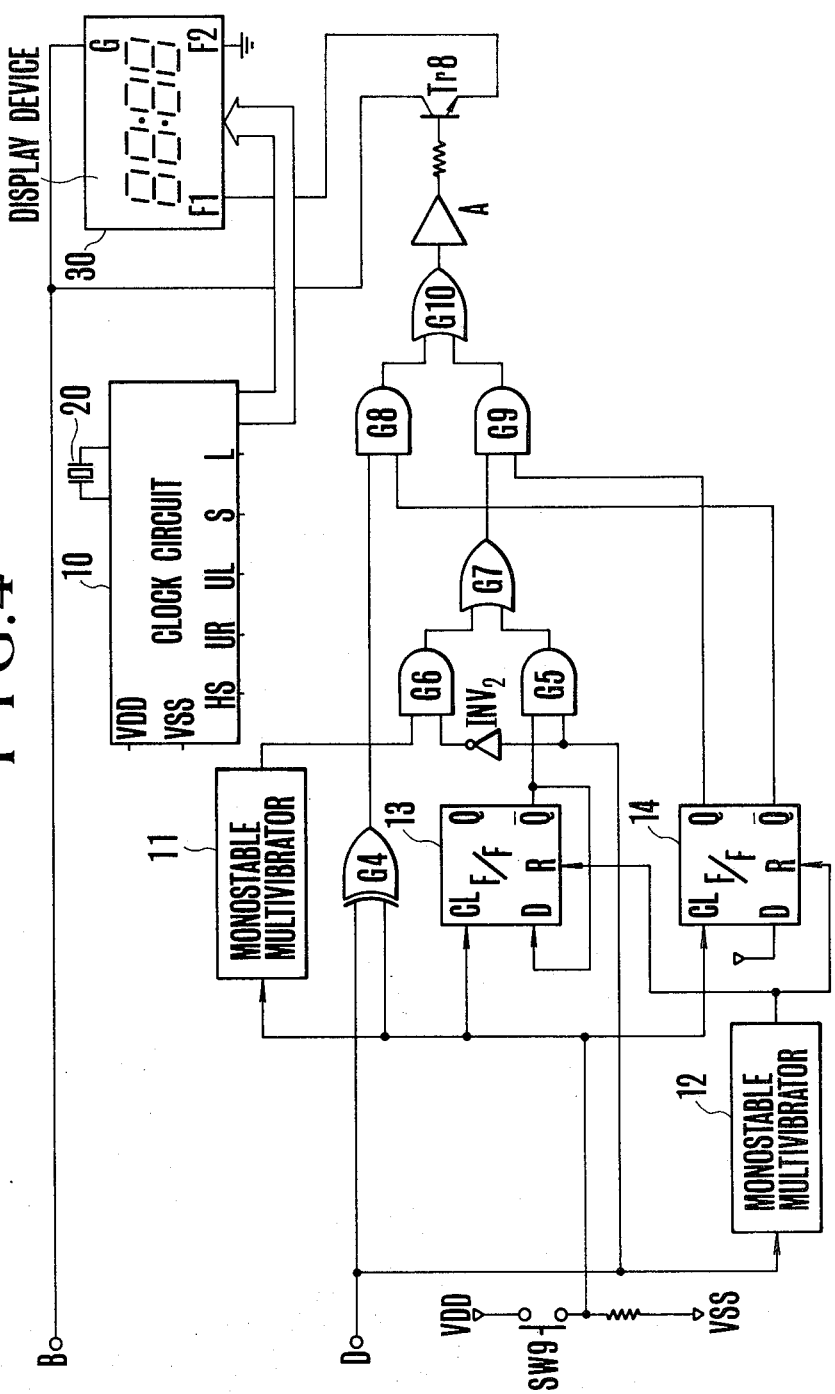
FIG. 4 is a connection diagram, partly in block form, illustrating still another embodiment of this invention.

FIG. 4 illustrates a block diagram showing another embodiment of this invention wherein similar elements to those shown in FIG. 1 are designated by the same reference characters. The circuit shown in FIG. 4 comprises a monostable multivibrator 11 which produces a "H" level output for several seconds when applied with an input pulse, a monostable multivibrator which produces a "H" level output for a small interval when supplied with an input pulse, and flip-flop circuits 13 and 14. A manually operated push button switch SW9 is connected between a voltage terminal $V_{DD}$ and a voltage terminal VSS.

In operation, where voltage is present on terminal D, since the inputs to an exclusive OR gate circuit G4 are "H" and "L" levels, it produces an "H" level output. One input to an AND gate circuit G5 is at the "H" level, and this input signal is inverted by an inverter INV2 and applied to one input of an AND gate circuit G6 as an "L" level input. In response to the signal applied to terminal D, the monostable multivibrator 12 produces, for a small interval, a "H" level output which is applied to the reset terminals R of the flip-flop circuits 13 and 14 for resetting them. When reset, the flip-flop circuit 13 produces an "L" level output at its Q output terminal and a "H" level output at its $\overline{Q}$ output terminal which is fed back to its driving D terminal. As a consequence, both inputs to the AND gate circuit G5 becomes the "H" level and it is enabled to produce a "H" level output. On the other hand, since the output of the monostable multivibrator 11 is at the "L" level, the AND gate circuit G6 is disabled to produce an "L" level output. As a consequence, one input to an OR gate circuit G7 becomes "H" level so that it produces a "H" level output.

The flip-flop circuit 14 is normally applied with a "H" level input at its driving D terminal, and therefore it is reset to produce an "L" level output on its Q output terminal and a "H" output on it $\overline{Q}$ output terminal. When this flip-flop circuit 14 is reset, both inputs to the AND gate circuit G8 become the "H" level, whereby this AND gate circuit is enabled to produce a "H" level output. Since one input to AND gate circuit G9 is at the "L" level, it is disabled to produce an "L" level output. Consequently, a "H" level input is applied to one input of an OR gate circuit G10, whereby it produces a "H" level output which is applied to the base electrode of a transistor Tr8 via a buffer amplifier A. This turns ON transistor Tr8 to apply the battery voltage at terminal B upon the filament terminal F1 to operate the fluorescent display device 30, thus displaying hours and minutes.

When the push button switch SW1 is depressed, the monostable multivibrator circuit 11 produces a "H" level output for several seconds, but since the other input to the AND gate circuit G6 is at the "L" level, this AND gate circuit G6 is disabled, thus producing an "L" level output. Since both inputs to the exclusive OR gate circuit G4 are at the "H" level, it produces an "L" level output, whereby the AND gate circuit G8 produces "L" level output which in turn causes the OR gate circuit G10 to produce an "L" level output. Thus, transistor Tr8 is turned off to deenergize the luminous display device 30.

When switch SW9 is closed, the inputs to the clock terminals of both flip-flop circuits 13 and 14 also become the "H" level and the operations thereof are reversed so that the output at the Q output of the flip-flop circuit 13 becomes the "H" level, whereas that at the $\overline{Q}$ output terminal becomes the "L" level. Likewise the output at the Q output terminal of the flip-flop circuit 14 becomes the "H" level and that at the output terminal $\overline{Q}$ becomes the "L" level. Since one input to the AND gate circuit G5 is at the "L" level, it is disabled to produce an "L" level output. This also causes the OR gate circuit G7 to produce an "L" level output, thus causing the AND gate circuit G9 to produce an "L" level output. Both inputs to the AND gate circuit G8 are at the "L" level, thus disabling the same. When the push button switch SW9 is released, the output of the exclusive OR gate circuit G4 becomes the "H" level. But, as the "L" level output of the $\overline{Q}$ output terminal of the flip-flop circuit 14 is supplied to one input of the AND gate circuit G8, this AND gate circuit G8 is disabled to produce an "L" level output. Consequently, the fluorescent display device 30 continues its inoperative condition.

When the switch SW9 is again depressed, the flip-flop circuit 14 continues to maintain its present state whereas the flip-flop circuit 13 reverses again its state with the result that its Q output becomes the "L" level and the $\overline{Q}$ output becomes the "H" level. Consequently, both inputs to the AND gate circuit G5 become the "H" level, whereby this AND gate circuit is enabled to produce a "H" level output which causes the OR gate circuit G7 to produce a "H" level output. Hence, both inputs to the AND gate circuit G9 become the "H" level, whereby this AND gate circuit is enabled to produce a "H" level output. This causes the OR gate circuit G10 to produce a "H" level output, thus turning ON transistor Tr8 to resume the display of the fluorescent display device 30. Thereafter, each time the switch SW9 is operated, the display mode and the non-display mode are repeated alternately.

Where the accessory contact or the ignition contact of the key switch is being closed and where the display of the luminous display device 30 is too bright to the eyes it is advantageous to select either one of the display mode and the non-display mode by mere operation of the push button switch SW9.

Where no voltage is impressed upon the terminal D, both inputs to the exclusive OR gate circuit G4 are at the "L" level so that it produces an "L" level output. Furthermore, as one input to the AND gate circuit G5 is at the "L" level, it is disabled, while this "L" level input being inverted by the inverter INV2 into a "H" level signal. However, as the other input to the AND gate circuit G6 is at the "L" level, it is disabled to produce an "L" level output and the OR gate circuit G7 produces an "L" level signal. Thus, both AND gate circuits G8 and G9 produce "L" level outputs, thus turning OFF transistor Tr8. Consequently, the fluorescent display device 30 is rendered inoperative.

When switch SW9 is depressed under these conditions, the input to the monostable multivibrator 11 becomes the "H" level causing it to produce a "H" output for several seconds. Consequently, both inputs to the AND gate circuit G6 become the "H" level, thus enabling the same to produce a "H" level output. As a consequence, the OR gate circuit G7 produces a "H" level output. Thus, both inputs to the AND gate circuit G9 become the "H" level and this AND gate circuit G9 is enabled to produce a "H" level output causing the OR gate circuit G10 to produce a "H" level output. This turns ON transistor Tr8 for energizing again the luminous display device 30. However, since the output of the monostable multivibrator 11 changes to the "L" level, the fluorescent display device returns to the inoperative state after displaying only several seconds. Thereafter, each time the push button switch SW9 is operated the fluorescent display device becomes operative for several seconds. Accordingly, where the accessory contact or the ignition contact of the key switch is being opened so that the luminescent display device is in its inoperative mode, it is possible to know the time by merely depressing the switch SW9.

In the presence of the voltage at terminal D, the flip-flop circuits 13 and 14 are both reset by the output of the monostable multivibrator 12, so that the component circuits are returned to the original states described above irrespective of their present states, thus assuring correct operation thereof.

In the embodiment described above, in response to the presence or absence of the voltage at terminal D1 the switch SW9 functions to display or not to display hours and minutes, and to change the mode to display hours and minutes to non-display mode and vice versa.

The monostable multivibrator and the flip-flop circuits constitute a transfer circuit that transfers the functions of the switch SW9. With the construction where the switch SW9 is connected directly to one input of the AND gate circuit G6 without using the monostable multivibrator 11, it is possible to display hours and minutes only while the switch SW9 is held closed.

While, in the foregoing embodiments, luminous display tube was used as the display device, it will be clear that luminous elements such as a light emitting diode, a plasma display device and a liquid crystal element can also be used.

As shown in the embodiments described with reference to FIGS. 2 and 4, since one switch can provide two functions, it is possible to decrease the number of switches on the panel board, thus providing the low cost display device which is convenient to use.

What is claimed is:

1. An electronic display device for use in a motor car, comprising manually operated switch means for changing contents displayed by said display device, and a control circuit actuated by a signal generated by an engine key switch of said motor car, said control circuit including means responsive to the operation of said manually operated switch means for switching over the contents displayed by said display device.

2. An electronic display device according to claim 1 wherein said display device comprises a luminous display element, and said control circuit comprises means to cause said luminous display element to operate or not to operate and means to cause said luminous display element to selectively display either one of times, dates, months, a calendar, voltage of a battery on said car.

3. The electronic display device according to claim 1 wherein said manually operated switch means includes means for selecting operative and inoperative modes and performances of said display device.

4. An electronic device for use in a motor car comprising:
a digital display device which becomes operative in response to a signal produced by closure of an accessory contact or an ignition contact of an engine key switch;
manually operated switch means responsive to the closure of the accessory contact or ignition contact of said engine key switch for producing a display change signal, said manually operated switch means including means for producing an operating signal of said digital display device when the accessory contact or ignition contact of said engine key switch is opened;
integrated circuit means responsive to said display change signal for changing mode of operation of said display device; and
a set enabling circuit responsive to the closure of the accessory contact or ignition contact of said engine key switch for changing the mode of operation of said display device;

5. An electronic device for use in a motor car comprising:
display means;
a plurality of means for determining items to be displayed by said display means;
display selection means connected between said plurality of item determining means and said display means;
means responsive to operation of an engine key switch or an ignition switch of said motor car for operating said display selection means to selectively interconnect said item determining means and said display means; and means responsive to a switching operation of said engine key switch or said ignition switch for modifying the operating of said item determining means.

6. An electronic timepiece for use in a motor car comprising:

fluorescent display means;

a clock circuit for generating signals for causing said fluorescent display means to display time, date, month, etc.;

means for applying a control signal representing an operating condition of said motor car;

a first monostable multivibrator for generating an output for a relatively long interval;

a second monostable multivibrator for generating an output for a relatively short interval;

a pair of flip-flop circuits responsive to the output of said second monostable multivibrator;

switch means for selectively applying different signals to said first monostable multivibrator and said pair of flip-flop circuits;

means responsive to said control signal and the output of said first monostable multivibrator and to the outputs of said pair of flip-flop circuits for rendering inoperative said display means; and means responsive to operation of said switch means for rendering operative said display means.

* * * * *